US009496377B2

United States Patent
Camillo-Castillo et al.

(10) Patent No.: US 9,496,377 B2
(45) Date of Patent: Nov. 15, 2016

(54) SELF-ALIGNED EMITTER-BASE-COLLECTOR BIPOLAR JUNCTION TRANSISTORS WITH A SINGLE CRYSTAL RAISED EXTRINSIC BASE

(71) Applicant: GLOBALFOUNDRIES INC., Grand Cayman (KY)

(72) Inventors: Renata Camillo-Castillo, Essex Junction, VT (US); Peng Cheng, Essex Junction, VT (US); Vibhor Jain, Essex Junction, VT (US); Qizhi Liu, Lexington, MA (US); John J. Pekarik, Underhill, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/747,525

(22) Filed: Jun. 23, 2015

(65) Prior Publication Data
US 2015/0311324 A1    Oct. 29, 2015

Related U.S. Application Data

(62) Division of application No. 14/151,225, filed on Jan. 9, 2014, now Pat. No. 9,111,986.

(51) Int. Cl.
| | | |
|---|---|---|
| *H01L 29/732* | (2006.01) | |
| *H01L 29/73* | (2006.01) | |
| *H01L 29/06* | (2006.01) | |
| *H01L 29/08* | (2006.01) | |

(Continued)

(52) U.S. Cl.
CPC ......... *H01L 29/732* (2013.01); *H01L 29/0649* (2013.01); *H01L 29/0821* (2013.01); *H01L 29/0826* (2013.01); *H01L 29/161* (2013.01); *H01L 29/165* (2013.01); *H01L 29/66242* (2013.01); *H01L 29/66272* (2013.01); *H01L 29/73* (2013.01); *H01L 29/7371* (2013.01)

(58) Field of Classification Search
CPC ............ H01L 29/7371; H01L 29/66318; H01L 29/66242; H01L 29/7378; H01L 29/1004
USPC ......................................... 257/197
See application file for complete search history.

(56) References Cited

U.S. PATENT DOCUMENTS

| | | |
|---|---|---|
| 5,087,580 A | 2/1992 | Eklund |
| 5,117,271 A | 5/1992 | Comfort et al. |

(Continued)

OTHER PUBLICATIONS

Comfort et al., "Conductive Etch Stop for Self Alignment Bipolar Transistors," IBM TDB, vol. 35, No. 4B, pp. 179-182, published Sep. 1992, and again in IP.COM as IPCOM000109722D, Mar. 24, 2005.

*Primary Examiner* — Quoc Hoang
(74) *Attorney, Agent, or Firm* — Thompson Hine LLP; Anthony Canale

(57) ABSTRACT

Fabrication methods, device structures, and design structures for a bipolar junction transistor. An intrinsic base layer is formed on a semiconductor substrate, an etch stop layer is formed on the intrinsic base layer, and an extrinsic base layer is formed on the etch stop layer. A trench is formed that penetrates through the extrinsic base layer to the etch stop layer. The trench is formed by etching the extrinsic base layer selective to the etch stop layer. The first trench is extended through the etch stop layer to the intrinsic base layer by etching the etch stop layer selective to the intrinsic base layer. After the trench is extended through the etch stop layer, an emitter is formed using the trench.

8 Claims, 12 Drawing Sheets

(51) Int. Cl.
*H01L 29/161* (2006.01)
*H01L 29/165* (2006.01)
*H01L 29/66* (2006.01)
*H01L 29/737* (2006.01)

(56) References Cited

U.S. PATENT DOCUMENTS

| | | |
|---|---|---|
| 5,340,753 A | 8/1994 | Bassous et al. |
| 5,665,614 A | 9/1997 | Hafizi et al. |
| 5,729,033 A | 3/1998 | Hafizi |
| 6,329,698 B1 | 12/2001 | Koscielniak et al. |
| 6,509,242 B2 | 1/2003 | Frei et al. |
| 6,531,720 B2 | 3/2003 | Freeman et al. |
| 6,642,553 B1 * | 11/2003 | Drews ............... H01L 29/66242 257/197 |
| 6,744,080 B2 * | 6/2004 | Chantre ............. H01L 29/7378 257/197 |
| 6,965,132 B1 | 11/2005 | Schuegraf |
| 7,119,416 B1 | 10/2006 | Adam et al. |
| 7,342,293 B2 | 3/2008 | Wallner et al. |
| 7,615,457 B2 | 11/2009 | Akatsu et al. |
| 8,067,290 B2 * | 11/2011 | Boeck ................ H01L 29/0649 257/E29.174 |
| 9,059,196 B2 | 6/2015 | Benoit et al. |
| 2015/0021738 A1 | 1/2015 | Camillo-Castillo et al. |

\* cited by examiner

SELF-ALIGNED EMITTER-BASE-COLLECTOR BIPOLAR JUNCTION TRANSISTORS WITH A SINGLE CRYSTAL RAISED EXTRINSIC BASE

BACKGROUND

The invention relates generally to semiconductor device fabrication and, in particular, to device structures for a bipolar junction transistor, as well as fabrication methods and design structures for a bipolar junction transistor.

Bipolar junction transistors are three-terminal electronic devices that include three semiconductor regions defining an emitter, an intrinsic base, and a collector. An NPN bipolar junction transistor includes two regions of n-type semiconductor material constituting the emitter and collector, and a region of p-type semiconductor material sandwiched between the two regions of n-type semiconductor material to constitute the intrinsic base. A PNP bipolar junction transistor includes two regions of p-type semiconductor material constituting the emitter and collector, and a region of n-type semiconductor material sandwiched between the two regions of p-type semiconductor material to constitute the base. The differing conductivity types of the emitter, base, and collector define a pair of p-n junctions, namely a collector-base junction and an emitter-base junction, across which the conductivity type changes. A voltage applied across the emitter-base junction controls the movement of charge carriers that produces charge flow between the collector and emitter.

Bipolar junction transistors may be found, among other end uses, in high-frequency and high-power applications. In particular, bipolar junction transistors may be used in radiofrequency integrated circuits, which are found in wireless communications systems, power amplifiers in mobile devices, and other varieties of high-speed end uses.

Improved device structures, fabrication methods, and design structures are needed for bipolar junction transistors.

SUMMARY

In an embodiment of the invention, a method is provided for forming a device structure for a bipolar junction transistor. The method includes forming an intrinsic base layer on a semiconductor substrate, forming an etch stop layer on the intrinsic base layer, and forming an extrinsic base layer on the etch stop layer. The method further includes forming a trench penetrating through the extrinsic base layer to the etch stop layer. The trench is formed by etching the extrinsic base layer selective to the etch stop layer. The method further includes extending the trench through the etch stop layer to the intrinsic base layer by etching the etch stop layer selective to the intrinsic base layer. After the trench is extended through the etch stop layer, an emitter is formed using the trench.

In an embodiment of the invention, a method is provided for forming a device structure for a bipolar junction transistor. The method includes forming an intrinsic base layer on a semiconductor substrate and forming an extrinsic base layer on the intrinsic base layer. The method further includes forming a trench penetrating through the extrinsic base layer to the intrinsic base layer by etching the extrinsic base layer selective to the intrinsic base layer. After the trench is formed, an emitter is formed in the trench.

In an embodiment of the invention, a hardware description language (HDL) design structure is encoded on a machine-readable data storage medium. The HDL design structure comprises elements that, when processed in a computer-aided design system, generates a machine-executable representation of a bipolar junction transistor. The HDL design structure includes an intrinsic base, an etch stop layer on the intrinsic base, an extrinsic base on the etch stop layer, a trench penetrating through the extrinsic base layer and the etch stop layer to the intrinsic base layer, and an emitter in the trench. The etch stop layer is comprised of a semiconductor material that etches selective to the semiconductor material of the extrinsic base and the semiconductor material of the intrinsic base. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
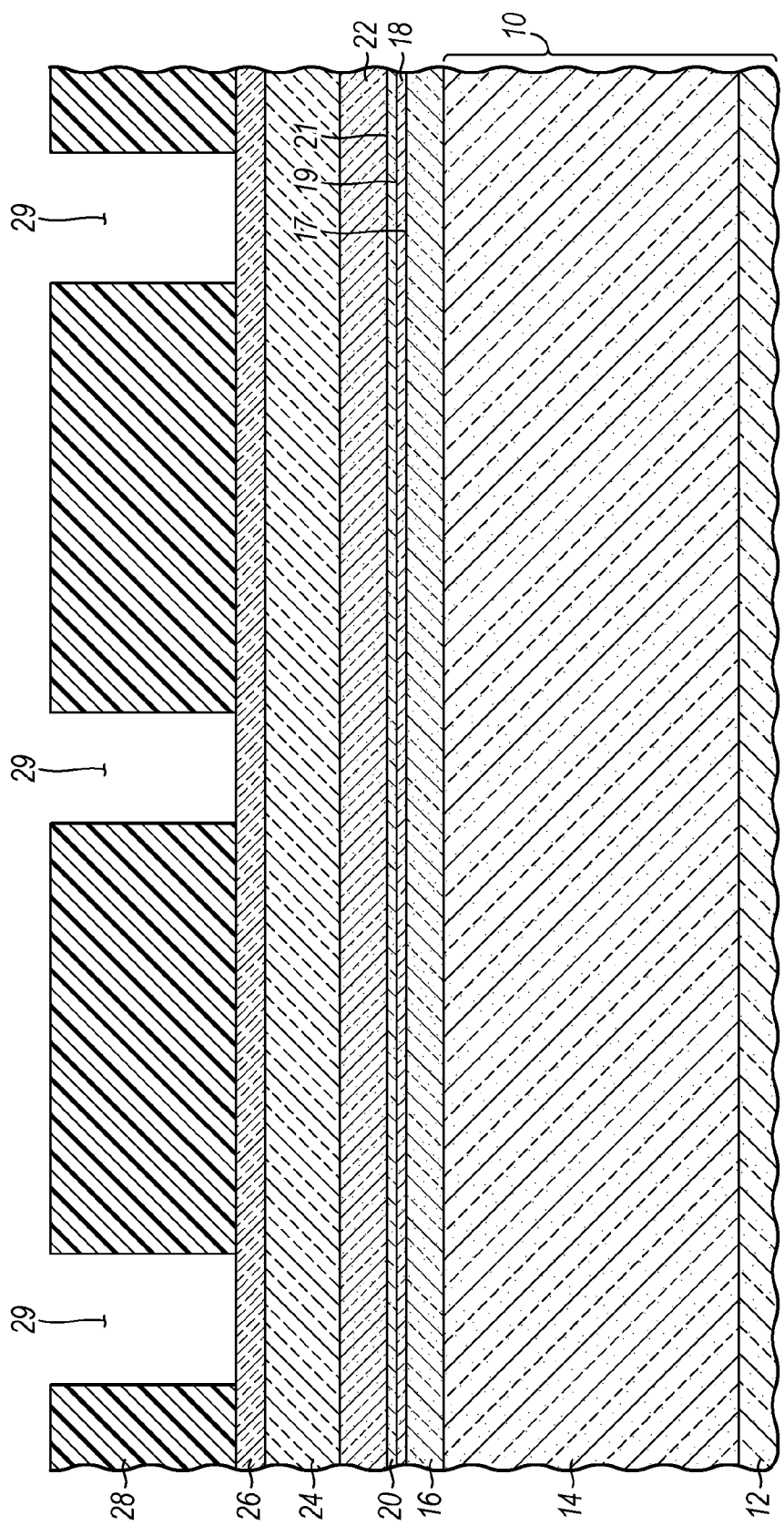
FIGS. 1-8 are cross-sectional views of a portion of a substrate at successive fabrication stages of a processing method for fabricating a device structure in accordance with an embodiment of the invention.

With reference to FIG. 1 and in accordance with an embodiment of the invention, a substrate 10 comprises a single crystal semiconductor material usable to form an integrated circuit. For example, substrate 10 may be comprised of a monocrystalline silicon-containing material, such as a bulk wafer of single crystal silicon or a single-crystal silicon device layer of a silicon-on-insulator wafer. The semiconductor material comprising substrate 10 may be lightly doped to alter its electrical properties.

A subcollector 12 is defined by a doped region in the substrate 10. The subcollector 12 may be formed by introducing an electrically-active dopant, such as an n-type dopant from Group V of the Periodic Table (e.g., phosphorus (P), arsenic (As), or antimony (Sb)) effective to impart n-type conductivity in the host semiconductor material. In one embodiment, the subcollector 12 may be formed by ion implantation of the n-type dopant with a photolithography-defined mask present and, thereafter, annealing to electrically activate the dopant and to alleviate implantation damage.

The substrate 10 includes an epitaxial layer 14 comprised of semiconductor material. The epitaxial layer 14 may be doped in situ during growth by, for example, chemical vapor deposition to have the same conductivity type as the subcollector 12 and is electrically continuous with the subcollector 12. For example, the epitaxial layer 14 may be comprised of single crystal silicon epitaxially deposited or grown by chemical vapor deposition (CVD) and doped with a concentration of an n-type dopant effective to impart n-type conductivity. The dopant may be introduced in situ during formation of the epitaxial layer 14 by adding a gas, such as phosphine or arsine, to the CVD reactants. The subcollector 12 and epitaxial layer 14 may have an opposite conductivity type from the bulk of the substrate 10.

Semiconductor layers 16, 18, 20, 22 are formed as continuous additive set of layers in a layer stack on the top surface of the substrate 10. Prior to deposition of the layer stack, the epitaxial layer 14 may be cleaned to, for example, remove native oxide.

The semiconductor layer 16 of the layer stack may be used subsequently to form the intrinsic base of the bipolar junction transistor. The semiconductor layer 16 may be comprised of a semiconductor material, such as silicon, silicon—germanium (SiGe) including silicon (Si) and germanium (Ge) in a composition with the silicon content ranging from 95 atomic percent to 50 atomic percent and the germanium content ranging from 5 atomic percent to 50 atomic percent, or SiGe:C with a composition having up to 10 percent carbon. In an embodiment, the semiconductor layer 16 may be SiGe with a stepped Ge profile, and may be doped with one or more impurity species, such as boron either with or without carbon.

The semiconductor layer 18 of the layer stack has a different composition from the semiconductor layer 16. For example, semiconductor layer 18 may have a composition that is adjusted during growth to not contain any germanium (Ge). In one embodiment, the semiconductor layer 18 may be entirely comprised of silicon (Si) that is intrinsic. An intrinsic base of the device structure is collectively formed using the semiconductor layers 16, 18 and, for that reason, the semiconductor layers 16, 18 may be considered to be sublayers belonging to a composite intrinsic base layer and eventually sublayers of a composite intrinsic base of the bipolar junction transistor.

The semiconductor layer 20 of the layer stack may function in a subsequent process step as an etch stop layer and, for at least that reason, may have a different composition than the semiconductor layer 22. The composition difference is chosen such that an etching process can be selected that removes semiconductor layer 20 at a much lower rate than semiconductor layer 22. The compositions of semiconductor layers 18 and 20 may also differ. In one embodiment, the semiconductor layer 20 may be comprised of a semiconductor material, such as silicon—germanium.

The semiconductor layer 22 of the layer stack may be used subsequently to form the extrinsic base of the bipolar junction transistor. The semiconductor layer 22 may be comprised of a semiconductor material, such as silicon that contains a dopant effective to impart p-type conductivity.

The semiconductor layers 16, 18, 20, 22 have an epitaxial relationship. The semiconductor layers 16, 18, 20, 22 may be serially formed using a low temperature epitaxial (LTE) growth process, such as ultra-high-vacuum (UHV) chemical vapor deposition (CVD) that may be conducted at a growth temperature ranging from 400° C. to 850° C. During epitaxy, the semiconductor layers 16, 18, 20, 22 will acquire the crystal structure of single crystal material of the substrate 10 and, in particular, the epitaxial layer 14 of the substrate 10, which serves as a crystalline template during growth.

A top surface of semiconductor layer 16 and a bottom surface of semiconductor layer 18 are coextensive along an interface 17. A top surface of semiconductor layer 18 and a bottom surface of semiconductor layer 20 are coextensive along an interface 19. A top surface of semiconductor layer 20 and a bottom surface of semiconductor layer 22 are coextensive along an interface 21. Due at least in part to the use of an epitaxial growth process, the interfaces 17, 19, 21 are planar and the respective adjacent surfaces of the layers 16, 18, 20 are likewise flat.

Dielectric layers 24, 26 are formed on a top surface of the semiconductor layer 22. Dielectric layer 24 may be comprised of an electrical insulator, such as silicon dioxide ($SiO_2$) deposited using CVD. Dielectric layer 26 may be comprised of a different electrical insulator, such as silicon nitride ($Si_3N_4$) deposited using CVD, and may be thinner than dielectric layer 24.

A patterned mask 28 is formed on a top surface of dielectric layer 26. The mask 28 may be comprised of a layer of sacrificial material that is applied and patterned with photolithography. To that end, the layer may be comprised of a photoresist that is applied by a spin coating process, pre-baked, exposed to a radiation projected through a photomask, baked after exposure, and developed with a chemical developer to form openings 29 in the patterned mask 28.

Figure 2:
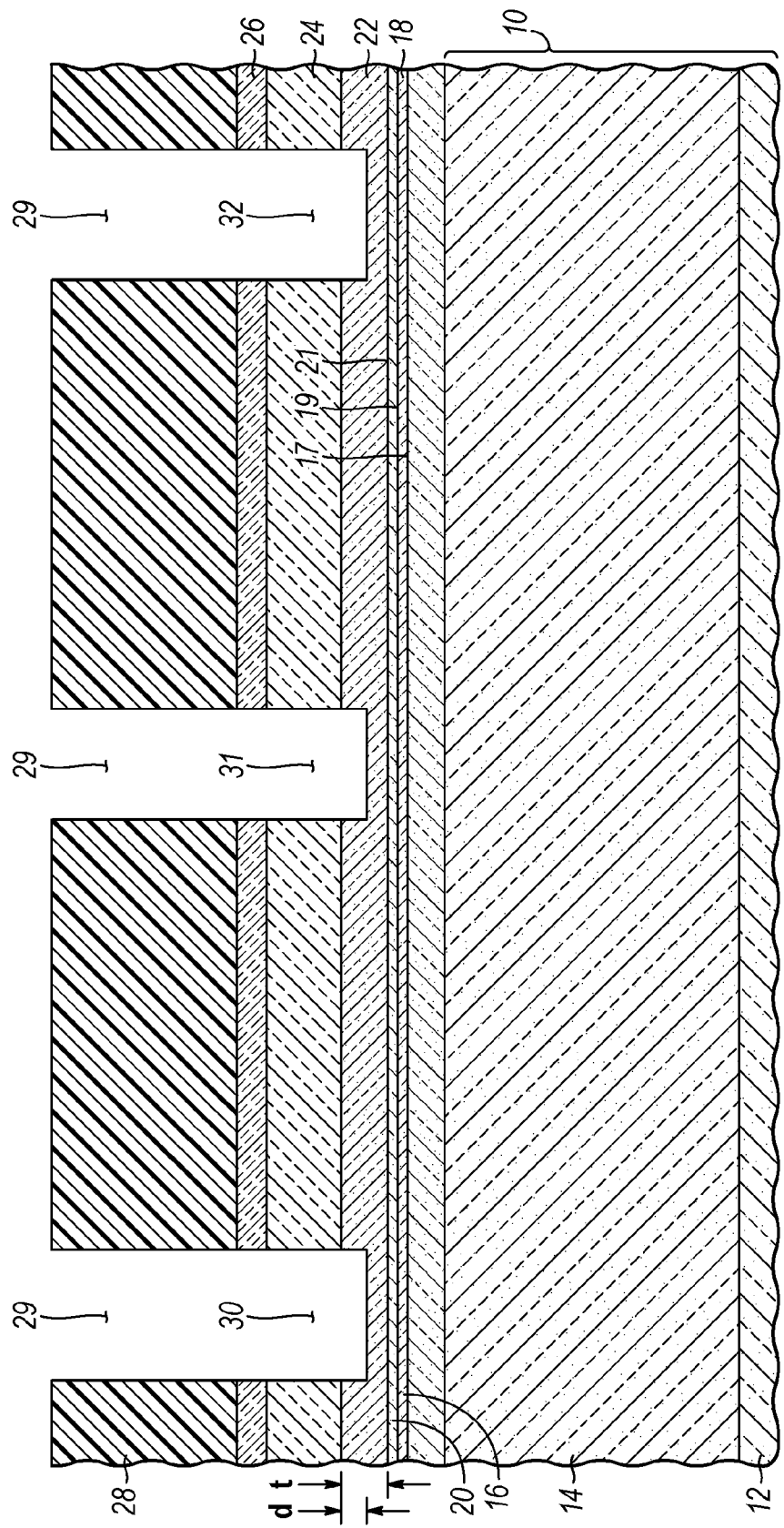

With reference to FIG. 2 in which like reference numerals refer to like features in FIG. 1 and at a subsequent fabrication stage of the processing method, a dry etch process, such as a reactive ion etch (RIE), may be used to remove unmasked portions of the dielectric layers 24, 26 and semiconductor layer 22 to define openings 30, 31, 32 that are in alignment with the openings 29 in the mask 28. The etch process is timed so that the openings 30, 31, 32 only penetrate partially through the thickness of semiconductor layer 22. Specifically, the openings penetrate to a depth, d, that is a fraction of the total thickness, t. The peripheral openings 30, 32 are subsequently used to form isolation trenches and the central opening 31 is subsequently used to form an emitter opening.

Figure 3:
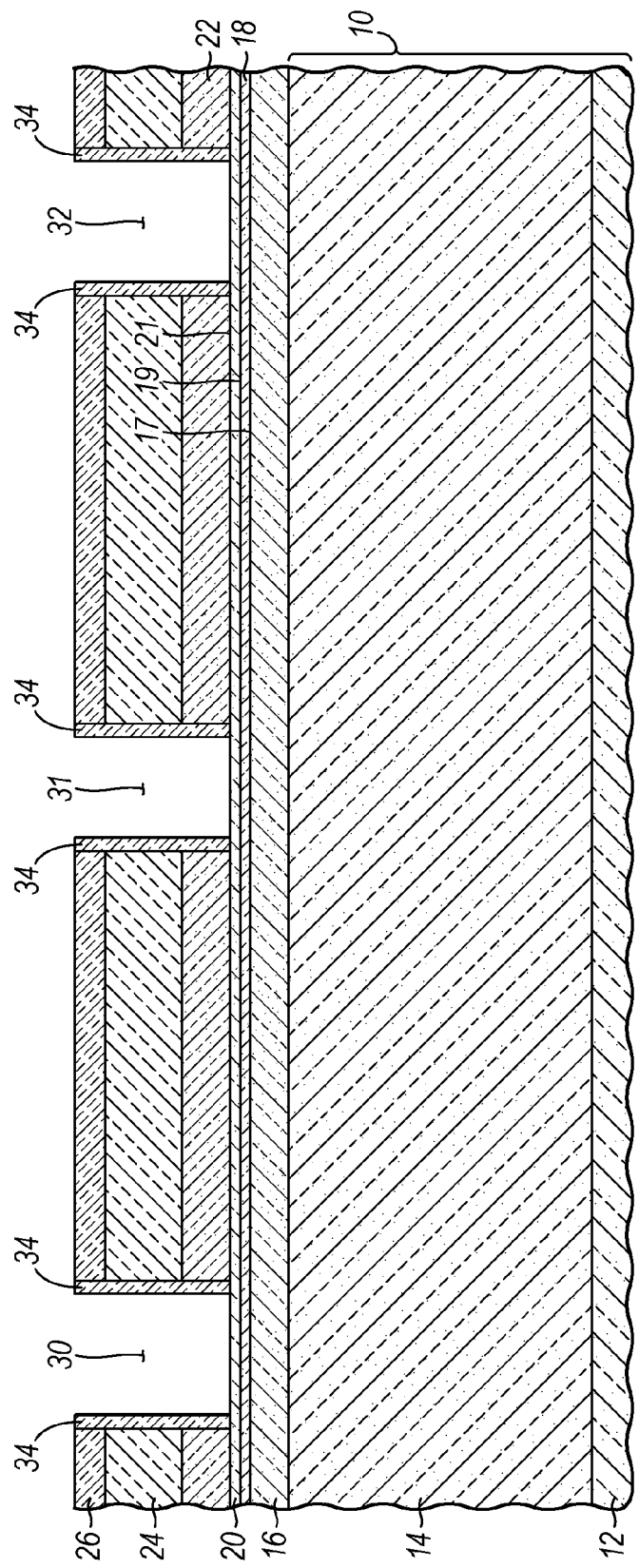

With reference to FIG. 3 in which like reference numerals refer to like features in FIG. 2 and at a subsequent fabrication stage of the processing method, the mask 28 is removed after the openings 30, 31, 32 are formed. If comprised of a photoresist, the mask 28 may be removed by ashing or solvent stripping, followed by surface cleaning. Optional spacers (not shown) may be formed inside the openings 30, 31, 32.

An etching process is used to extend the openings 30, 31, 32 through the remaining thickness of the semiconductor layer 22. The remaining thickness is given by the difference between thickness, t, and depth, d (FIG. 2). The etching process stops on the semiconductor layer 20, which guides the selection of an etching process that removes the semiconductor layer 22 at a significantly higher rate than the semiconductor layer 20. An exemplary etching process may be a wet chemical etch using a solution of potassium hydroxide (KOH), potassium dichromate ($K_2Cr_2O_7$), propanol, and water that removes silicon comprising semiconductor layer 22 selective to silicon—germanium comprising semiconductor layer 20.

Spacers 34 may be formed inside the openings 30, 31, 32. The spacers 34 may be formed by depositing conformal layers comprised of an electrical insulator, such as a layer of silicon dioxide ($SiO_2$) and a layer of silicon nitride ($Si_3N_4$), and shaping the conformal layers with one or more etching process, such as RIE, chemical oxide removal (COR), etc.

Figure 4:
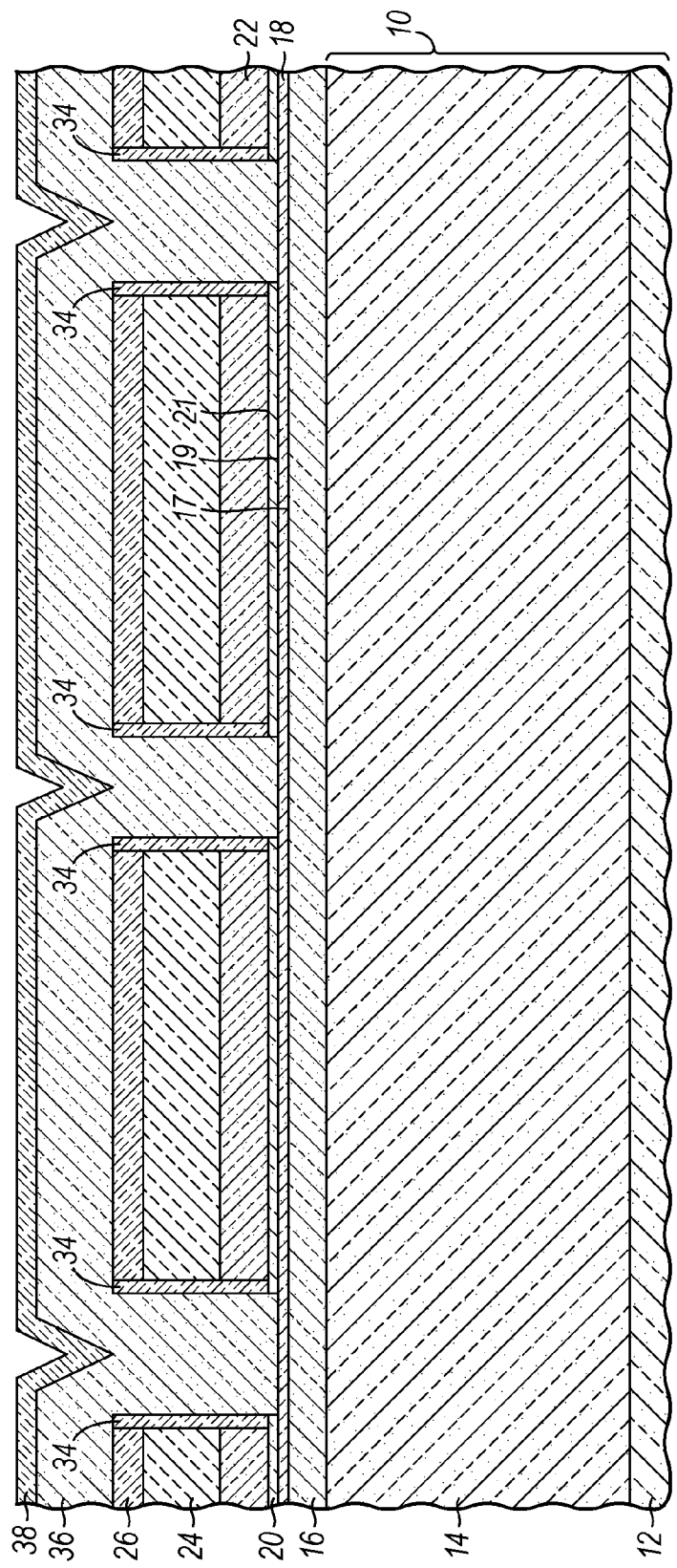

With reference to FIG. 4 in which like reference numerals refer to like features in FIG. 3 and at a subsequent fabrication stage of the processing method, an etching process is used to extend the openings 30, 31, 32 through the semiconductor layer 20. The etching process stops on the semiconductor layer 18, which guides the selection of an etching process that removes the semiconductor layer 20 at a significantly higher rate than the semiconductor layer 18. An exemplary etching process may comprise a wet chemical etch using a solution of ammonium hydroxide ($NH_4OH$), hydrogen peroxide ($H_2O_2$), and water ($H_2O$) or a solution of hydrofluoric acid (HF), nitric acid ($HNO_3$), and $H_2O$ that removes silicon—germanium semiconductor layer 20 selective to silicon semiconductor layer 18.

A passivation layer, such as a layer of silicon dioxide ($SiO_2$), is applied to passivate the surfaces of semiconductor layer 18 exposed at the bottom of the openings 30, 31, 32. The passivation layer is removed prior to depositing a semiconductor layer 36 that contacts these exposed surfaces of semiconductor layer 18 at the bottom of the openings 30, 31, 32. Chemical oxide removal may be used to remove the passivation layer, if comprised of $SiO_2$, to provide clean surfaces for the growth of the semiconductor layer 36.

The semiconductor layer 36 fills the openings 30, 31, 32, is subsequently used to form the emitter of the bipolar junction transistor inside and about opening 31, and is extraneous material inside openings 30, 32. The semiconductor layer 36 may be comprised of polysilicon deposited by CVD or low-pressure CVD (LPCVD) and heavily doped with a concentration of an n-type dopant effective to impart n-type conductivity. The heavy-doping level reduces the resistivity of the polysilicon, and may be introduced by in situ doping that adds a dopant gas, such as phosphine or arsine, to the CVD reactant gases. A cap layer 38 is then formed to cover the semiconductor layer 36. The cap layer 38 may be comprised of an electrical insulator, such as silicon dioxide ($SiO_2$).

Figure 5:
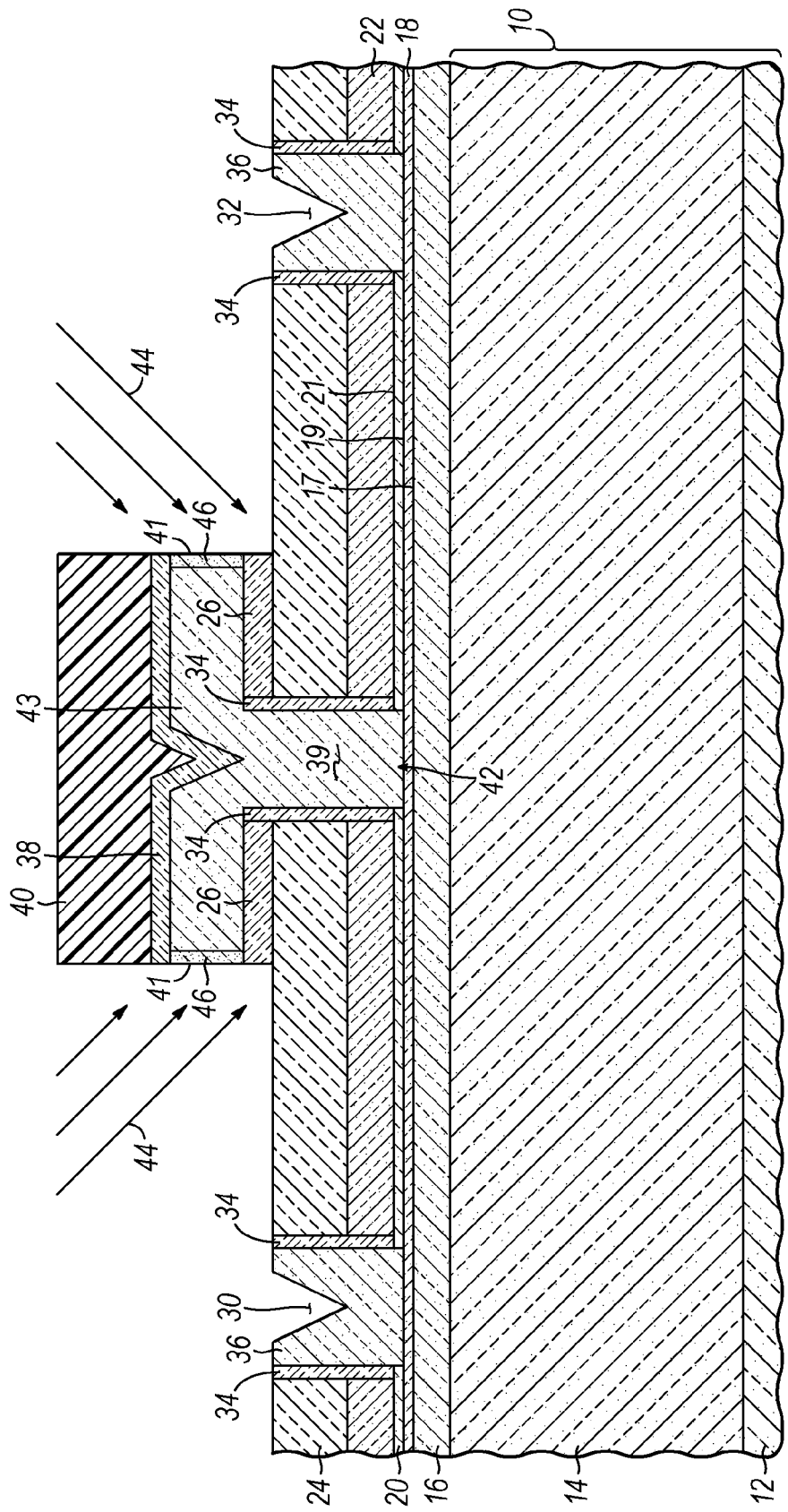

With reference to FIG. 5 in which like reference numerals refer to like features in FIG. 4 and at a subsequent fabrication stage of the processing method, a patterned mask 40 is formed that covers a section of the semiconductor layer 36 that is coextensive with the opening 31. The mask 40 may be comprised of a layer of sacrificial material that is applied and photolithographically patterned. To that end, the layer may be comprised of a photoresist that is applied by a spin coating process, pre-baked, exposed to a radiation projected through a photomask, baked after exposure, and developed with a chemical developer to form the patterned mask 40.

A wet chemical etching process may be used to remove portions of the cap layer 38 that are not protected by the patterned mask 40. If the cap layer 38 is comprised of an oxide of silicon, the wet chemical etching process may utilize a wet chemical etchant comprising buffered hydrofluoric acid (BHF) or diluted hydrofluoric acid (DHF).

An etching process, such as RIE, is used to remove the field regions of the dielectric layer 26 and the semiconductor layer 36. Residual portions of layers 26, 36 registered with the opening 31 are protected by the patterned mask 40 during the etching process. The residual portion of semiconductor layer 36 defines an emitter 42 of the bipolar junction transistor that has a body 39 that fills the opening 31 and that has a head 43 outside of the opening. The edges of the head 43 of the emitter 42 extend laterally to have a slight overlap with the dielectric layer 24. Portions of semiconductor layer 36 may remain in openings 30, 32 at the conclusion of the etching process, and remain extraneous material. The portion of semiconductor layer 18 inside of opening 31 may be considered to define an "i-layer".

Doped regions 46 are formed as a protective layer at respective sidewalls 41 of the head 43 of the emitter 42. Energetic ions, as indicated diagrammatically by the single-headed arrows 44, may be introduced over a shallow depth using an angled ion implantation process to form the doped regions 46. The implantation conditions (e.g., kinetic energy and dose) are selected to form the doped regions 46 with a desired depth profile and doping concentration at the shallow depth. As used herein, the term "angled implantation" denotes that the ion trajectories impinge the top surface traveling at incident angles that than 0°, wherein 0° represents a direction normal (i.e., perpendicular) to the top surface. The implanted dopant may comprise a p-type dopant species (e.g., boron), and the doped regions 46 may have an opposite conductivity type from the bulk of the emitter 42. The mask 40 operates as an ion-implantation mask that protects the remainder of the emitter 42, other than the sidewalls 41, against receiving an implanted dose of the ions 44. The properties of the mask 40 are selected to stop implanted ions from reaching the top surface of the emitter 42. The semiconductor layers 16, 18, 20, 22 are also masked during the implantation.

Figure 6:
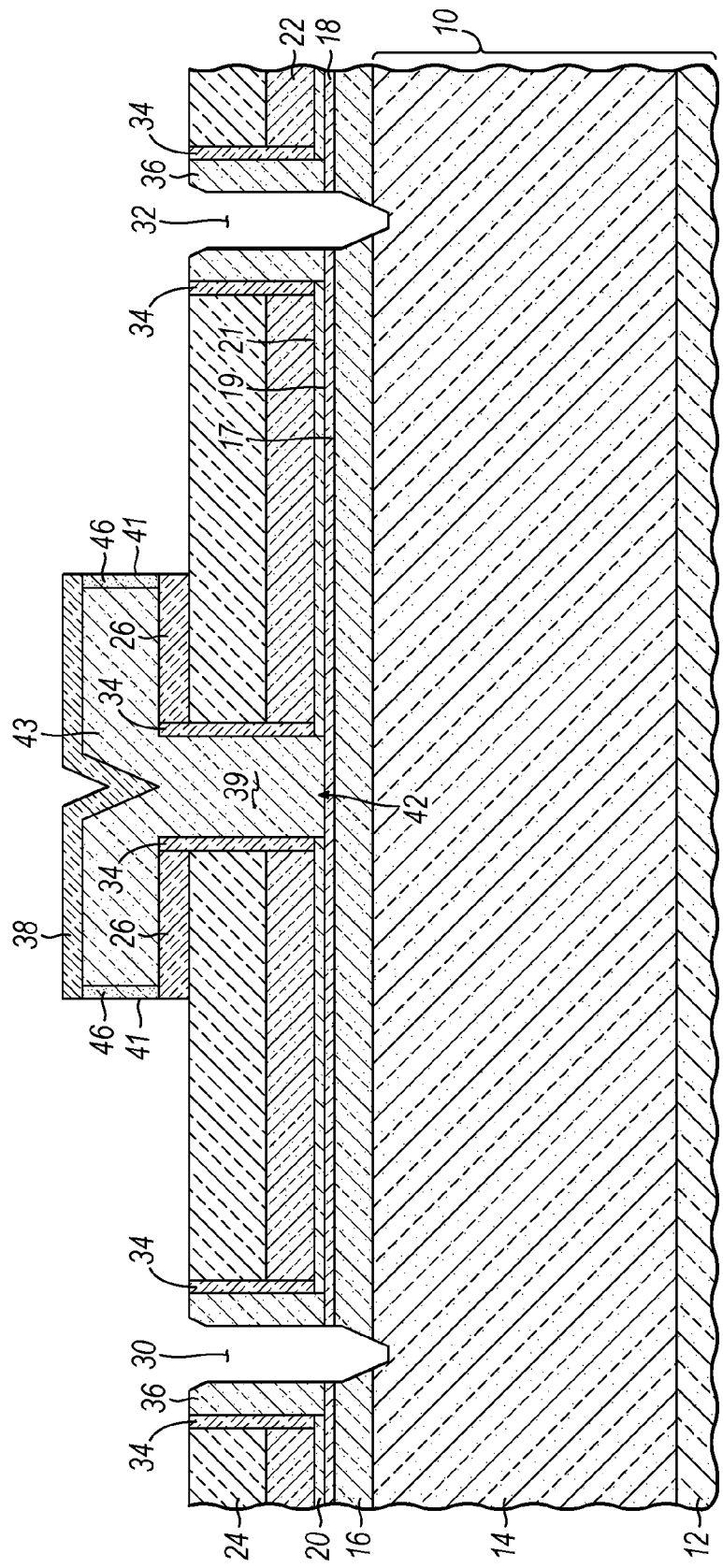

With reference to FIG. 6 in which like reference numerals refer to like features in FIG. 5 and at a subsequent fabrication stage of the processing method, an etching process is used to extend the openings 30, 32 through the remaining portions of semiconductor layer 36 in openings 30, 32 and the semiconductor layers 16, 18, and to a shallow depth into the epitaxial layer 14 of the substrate 10. The etching process is selected to remove the semiconductor materials of layers 16, 18, 36 selective to the dielectric material(s) comprising dielectric layer 24 and cap layer 38. For example, if the dielectric layer 24 and cap layer 38 are comprised of silicon dioxide and the semiconductor layers 16, 18, 36 are comprised of silicon, the etchant may be selected to etch silicon selective to silicon dioxide. After the conclusion of the etching process, the mask 40 is removed. If comprised of a photoresist, the mask 40 may be removed by ashing or solvent stripping, followed by surface cleaning.

Figure 7:
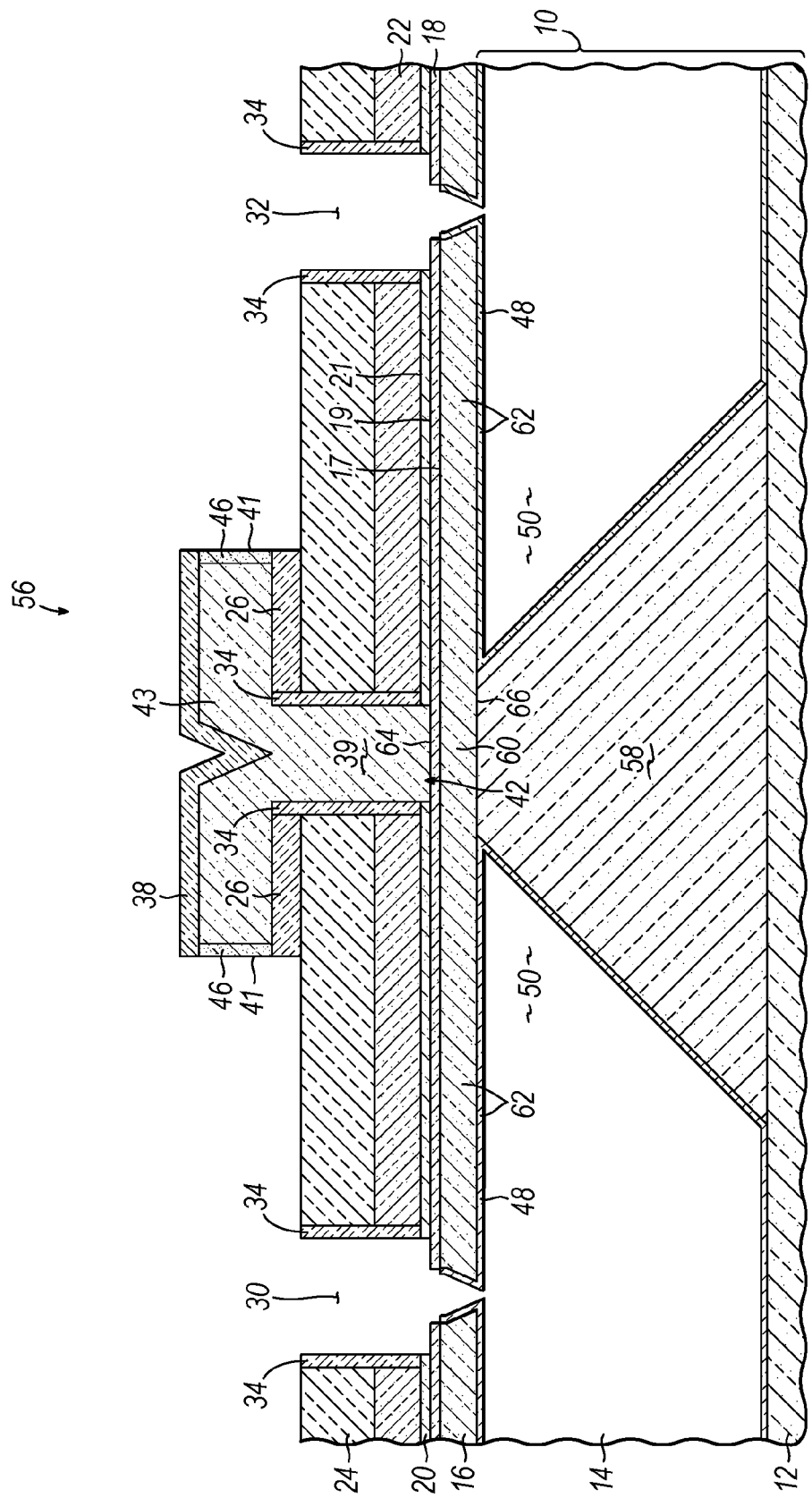

With reference to FIG. 7 in which like reference numerals refer to like features in FIG. 6 and at a subsequent fabrication stage of the processing method, isolation regions 50 are formed in the substrate 10 and undercut the semiconductor layer 16. Each isolation region 50 may have the form of an airgap, which may be characterized by an effective dielectric constant of near unity (about 1.0). The isolation regions 50 may be filled by air at or near atmospheric pressure, filled by another gas at or near atmospheric pressure, or contain air or another gas at a sub-atmospheric pressure (e.g., a partial vacuum). The isolation regions 50 may be connected to form a continuous air gap.

To form the isolation regions 50, the semiconductor material of the substrate 10 may be etched by a wet chemical etching process, a dry etching process, or a combination of wet chemical and dry etching processes selective to the materials of the spacers 34, the semiconductor layer 16, the shallow doped regions 46 in the sidewalls 41 of the head 43 of the emitter 42, the cap layer 38, and the dielectric layer 24. The profile of the isolation regions 50 may be adjusted to have a specific shape, undercutting angle, undercut distance (i.e., bias), etc. by selecting factors such as the chemistry, duration, etc. of the etching process. The etching process may be combined with implantation damage to the semiconductor material and/or doping of the semiconductor material to alter etch rates and, thereby, the profile. The etching process may further rely on wafer orientation and anisotropic etching processes that exhibit different etch rates for different crystallographic directions (as specified by, for example, Miller indices) in a single-crystal semiconductor material. In one embodiment, the etching process may be a wet chemical etching process that is anisotropic and that uses an etchant comprising potassium hydroxide (KOH), ammonium hydroxide (NH$_4$OH), tetramethylammonium hydroxide (TMAH), or ethylenediamine pyrocatechol (EDP).

A passivation layer 48 may be formed that covers the exposed surfaces surrounding the isolation regions 50. The passivation layer 48 may be comprised of a dielectric material, such as an electrical insulator like a high temperature oxide (HTO) grown by either wet or dry thermal oxidation, and serves to passivate the semiconductor materials of the exposed surfaces surrounding the isolation regions 50.

A collector 58 of a bipolar junction transistor 56 is defined in the substrate 10 by the portion of the epitaxial layer 14 that is located between isolation regions 50. The collector 58 may be comprised of the semiconductor material of the epitaxial layer 14 in its as-grown state or may receive an additional ion implantation to further enhance its conductivity. The mask 40 used to form the isolation regions is the same mask that is used to define the head 43 of the emitter 42.

An intrinsic base 60 is defined by the portions of semiconductor layers 16, 18 that are between the openings 30, 32 and that are directly underneath emitter 42. An extrinsic base 62, which is raised relative to the intrinsic base 60, is defined by portions of layers 20, 22 between the openings 30, 32 and also portions of layers 16, 18 between the openings 30, 32 other than their contribution to the intrinsic base 60. The extrinsic base 62 has a planar top surface and a planar bottom surface because at least in part, it is formed from layers 16, 18, 22 that are formed on a planar surface of substrate 10. The body 39 of the emitter 42 and spacers 34 interrupt the continuity of the extrinsic base 62. An emitter-base junction 64 is defined at the interface between the emitter 42 and the intrinsic base 60, and a collector-base junction 66 is defined at the interface between the intrinsic base 60 and the collector 58. Due primarily to the use of masked etches to form the openings 30, 31, 32, the emitter 42, isolation regions 50, collector 58, and intrinsic base 60 are self-aligned relative to each other.

The bipolar junction transistor 56 occupies a device region, which can be divided into an intrinsic device region coinciding with the portions of the emitter 42, intrinsic base 60, and collector 58 participating in the junctions 64, 66, and an extrinsic device region outside of the intrinsic device region. The bipolar junction transistor 56 may be characterized as a heterojunction bipolar transistor if at least two of the emitter 42, collector 58, and intrinsic base 60 are comprised of different semiconductor materials. In the representative embodiment, the bipolar junction transistor 56 is an NPN bipolar junction transistor that includes two regions of n-type semiconductor material constituting the emitter 42 and collector 58, and a region of p-type semiconductor material sandwiched between the two regions of n-type semiconductor material to constitute the intrinsic base 60.

During the front-end-of-line (FEOL) portion of the fabrication process, the device structure of the bipolar junction transistor 56 is replicated across at least a portion of the surface area of the substrate 10. A layer of photoresist may be applied to regions of the substrate 10 being used to form the bipolar junction transistors 56 following this fabrication stage. Protective layers may be removed from other regions of the substrate 10 to form complementary metal-oxide-semiconductor (CMOS) field-effect transistors. The order in which the field-effect transistors and bipolar junction transistors are formed may be reversed. As a result, both bipolar junction transistors and CMOS transistors may be available on the same substrate 10.

Figure 8:
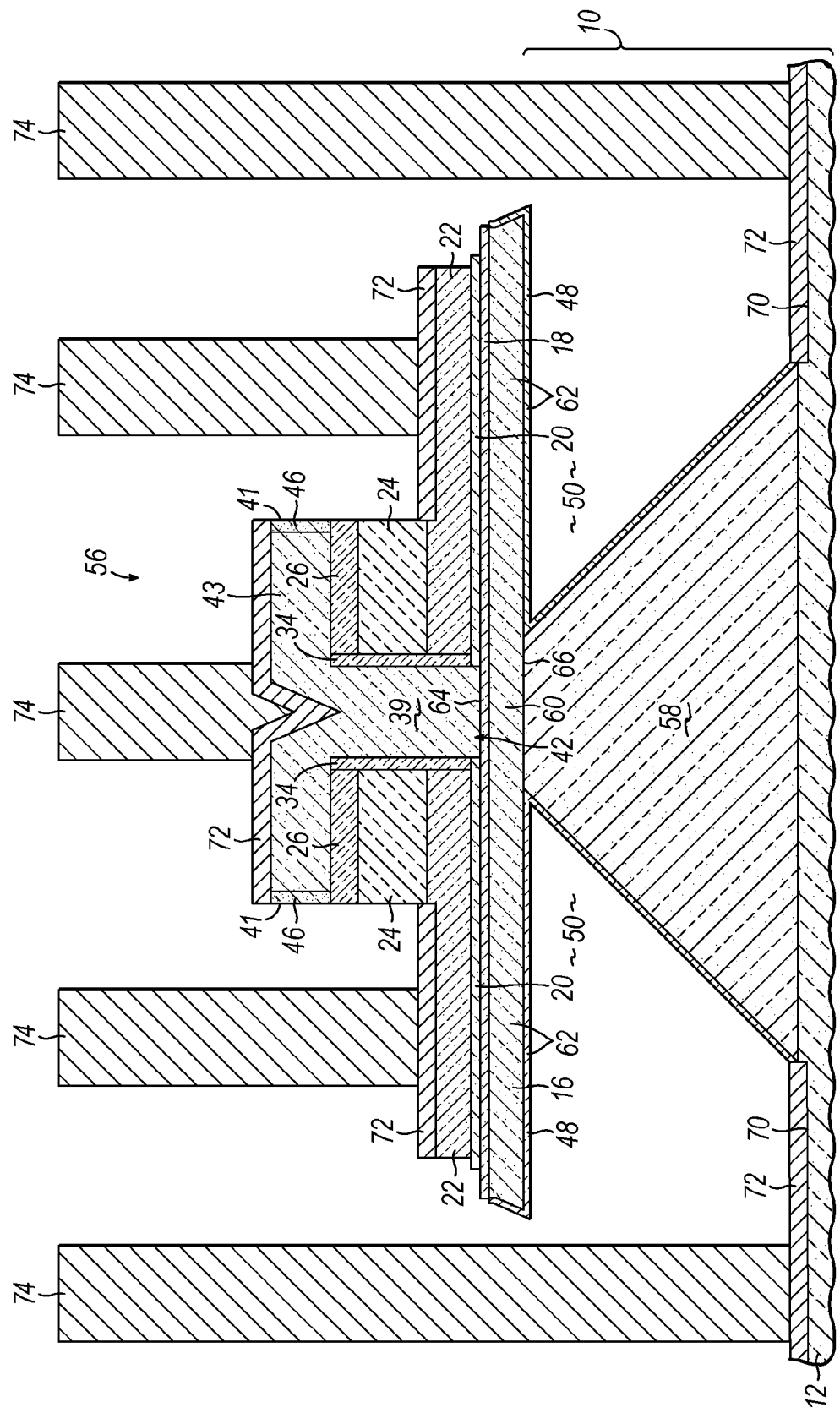

With reference to FIG. 8 in which like reference numerals refer to like features in FIG. 7 and at a subsequent fabrication stage of the processing method, field regions of the various layers are removed while the emitter 42 and extrinsic base 62 of the bipolar junction transistor 56 are protected by a mask layer. The field region removal exposes a contact area 70 comprised of the semiconductor material of the substrate 10. The contact area 70 may be used to establish electrical contact with the collector 58. The spacers 34, cap layer 38, and dielectric layer 24 are completely or partially removed.

Standard middle-end-of-line (MEOL) and back-end-of-line (BEOL) processing follows, which includes silicide formation, formation of contacts and wiring for the local interconnect structure to the bipolar junction transistor 56, and formation of dielectric layers, via plugs, and wiring for an interconnect structure coupled by the interconnect wiring with the bipolar junction transistor 56. Other active and passive circuit elements, such as diodes, resistors, capacitors, varactors, and inductors, may be integrated into the interconnect structure and available for use in the integrated circuit.

Sections 72 of a silicide layer are formed on the emitter 42, the extrinsic base 62, and the contact area 70. The sections 72 of the silicide layer may be formed by a silicidation process that involves one or more annealing steps to form a silicide phase by reacting a layer of silicide-forming metal and the semiconductor material contacting the silicide-forming metal. Contacts 74 are formed in a layer of insulating material (not shown) to provide electrical connections with the sections 72 of the silicide layer on the contact area 70, the emitter 42, and the extrinsic base 62. The contacts 74 are comprised of a conductor, such as a refractory metal like tungsten (W), which can be clad with a conductive liner (e.g., titanium nitride (TiN)), and the dielectric layer may be comprised of an electrically-insulating dielectric material, such as borophosphosilicate glass (BPSG).

Figure 9:
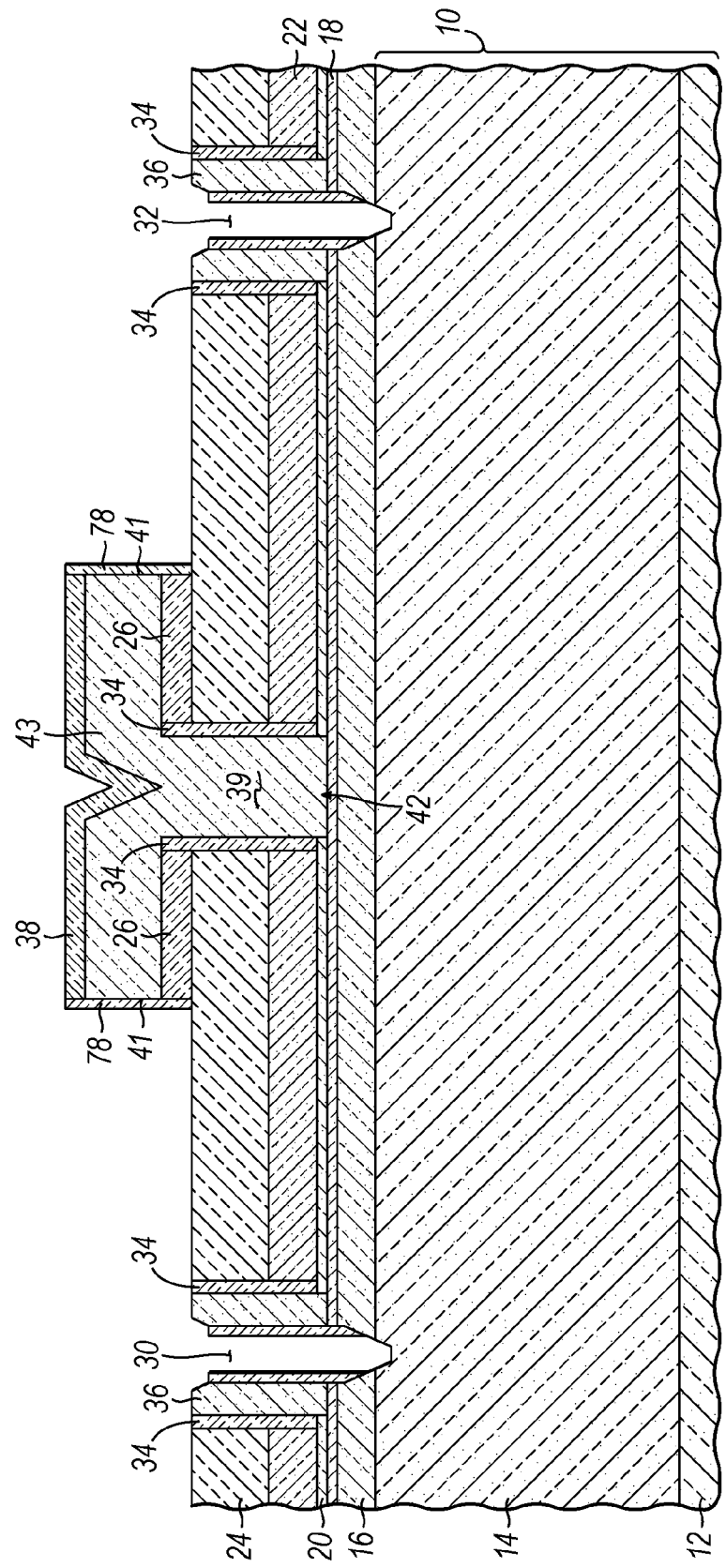
FIG. 9 is a cross-sectional view similar to FIG. 6 of a substrate portion for fabricating a device structure in accordance with an alternative embodiment of the invention.

With reference to FIG. 9 in which like reference numerals refer to like features in FIG. 6 and in accordance with an alternative embodiment of the invention, dielectric spacers 78 may be formed as a protective layer at the sidewalls 41 of the head 43 of the emitter 42. The dielectric spacers 78 may be formed by depositing a conformal layer comprised of an electrical insulator, such silicon nitride ($Si_3N_4$), and shaping the conformal layer with one or more etching process, such as RIE. The presence of the dielectric spacers 78 may eliminate the need to implant ions 44 (FIG. 5) to form the shallow doped regions 46 because the dielectric spacers 78 may serve a similar protective function during the etching process forming the isolation regions 50. The process flow continues as described in FIGS. 7-8 to form the bipolar junction transistor 56.

Figure 10:
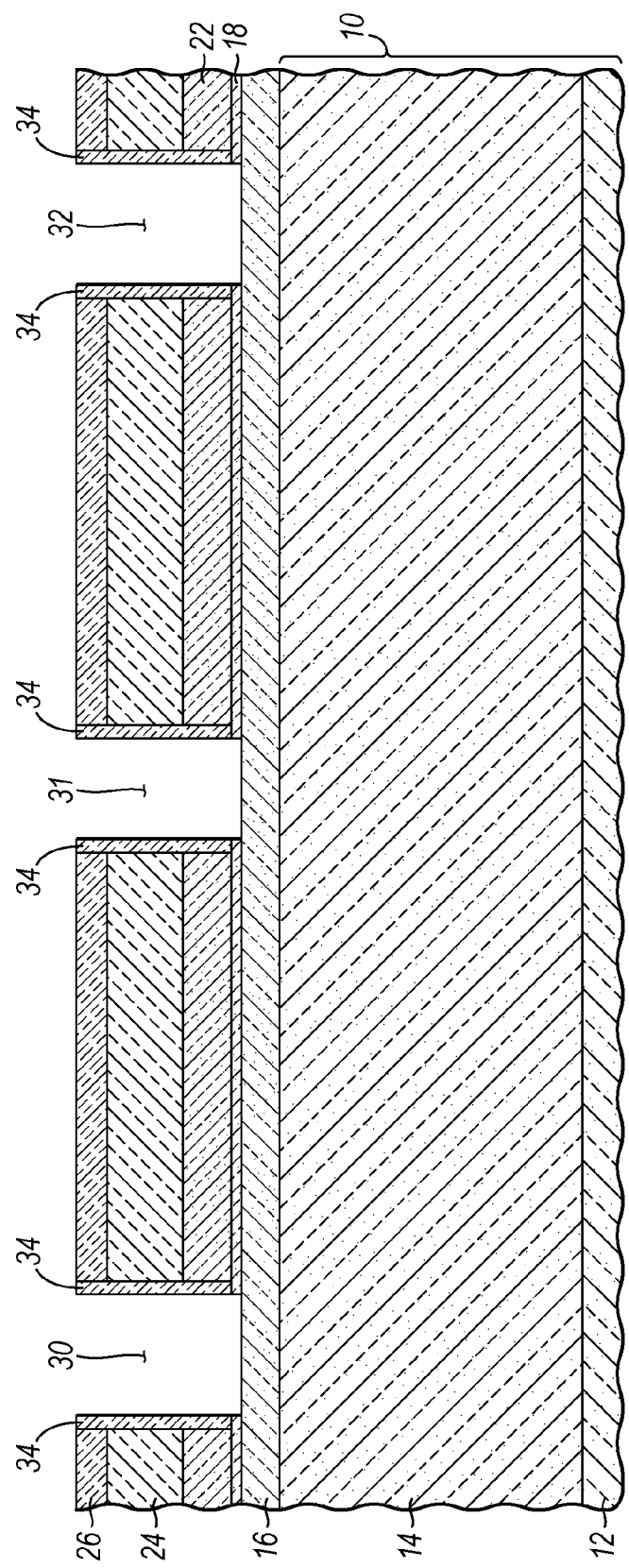
FIG. 10 is a cross-sectional view similar to FIG. 3 of a substrate portion for fabricating a device structure in accordance with an alternative embodiment of the invention.

With reference to FIG. 10 in which like reference numerals refer to like features in FIG. 3 and in accordance with an alternative embodiment of the invention, semiconductor layer 20 may be omitted from the layer stack formed on the substrate 10. When the openings 30, 31, 32 are formed, an etching process is used that stops on the semiconductor material of semiconductor layer 16. An exemplary etching process may comprise a wet chemical etch using a solution of potassium hydroxide (KOH), potassium dichromate ($K_2Cr_2O_7$), propanol, and water that removes silicon selective to silicon—germanium.

Figure 11:
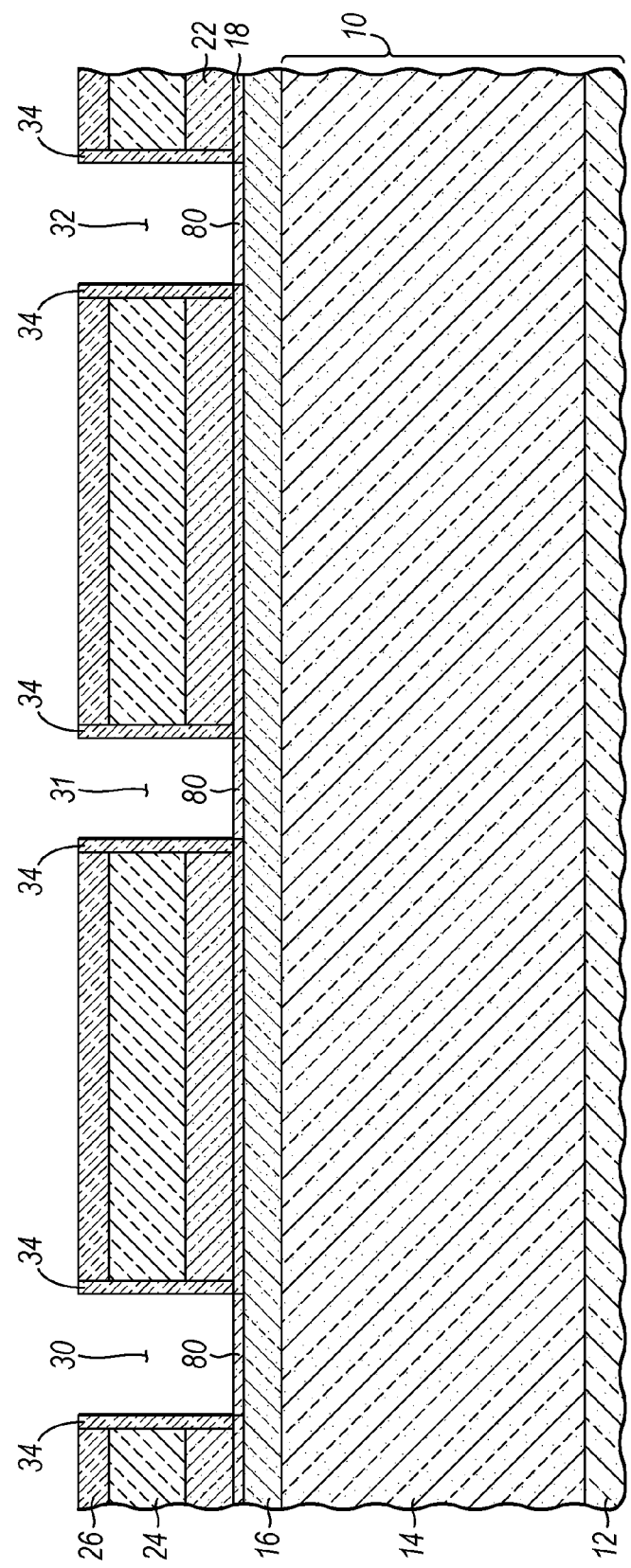
FIG. 11 is a cross-sectional view of the substrate portion of FIG. 10 at subsequent fabrication state.

With reference to FIG. 11 in which like reference numerals refer to like features in FIGS. 10 and 5 and at a subsequent fabrication stage of the processing method, sections 80 of the semiconductor material of semiconductor layer 18 are formed by an epitaxial growth process inside the openings 30, 31, 32 to replace the sections removed by the etching process. In particular, the section 80 of semiconductor layer 18 inside opening 31 separates the emitter 42 from the intrinsic base 60 and defines the "i-layer". The process flow continues as described in FIGS. 4-8 to form the bipolar junction transistor 56.

Figure 12:
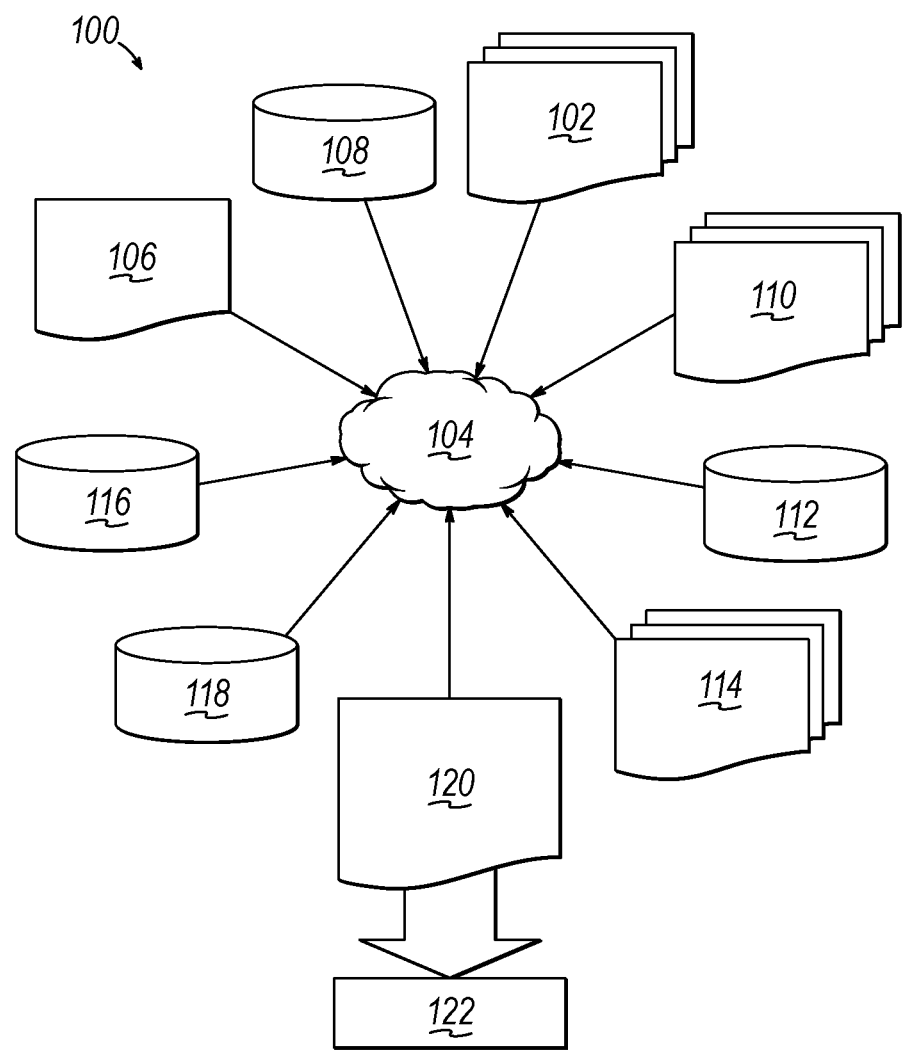
FIG. 12 is a flow diagram of a design process used in semiconductor design, manufacture, and/or test.

FIG. 12 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-11. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1-11. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1-11 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-11. In one embodiment, design structure 120 may comprise a compiled, executable HDL simulation model that functionally simulates the devices shown in FIGS. 1-11.

Design structure 120 may also employ a data format used for the exchange of layout data of integrated circuits and/or symbolic data format (e.g., information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 120 may then proceed to a stage 122 where, for example, design structure 120: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor, the device structure comprising:
    an intrinsic base comprised of a first semiconductor material;
    an etch stop layer on the intrinsic base, the etch stop layer comprised of a second semiconductor material;
    an extrinsic base on the etch stop layer, the extrinsic base comprised of a third semiconductor material;
    a first trench penetrating through the extrinsic base and the etch stop layer to the intrinsic base; and
    an emitter in the first trench,
    wherein the second semiconductor material etches selective to the first semiconductor material and the third semiconductor material.

2. The device structure of claim 1 wherein the intrinsic base includes a first sublayer and a second sublayer between the first sublayer and the etch stop layer, and the first sublayer is comprised of the first semiconductor material, and the second sublayer is comprised of a fourth semiconductor material different from the second semiconductor material of the etch stop layer.

3. The device structure of claim 1 wherein the intrinsic base is formed on a semiconductor substrate, and further comprising:
    an isolation region in the semiconductor substrate, the isolation region extending beneath the intrinsic base; and
    a collector in the semiconductor substrate, the collector being coextensive with the isolation region.

4. The device structure of claim 3 wherein the isolation region is an air gap, the second semiconductor material comprises silicon—germanium, and the third semiconductor material comprises silicon.

5. The device structure of claim 1 wherein the emitter includes a head that protrudes out of the first trench, and further comprising:
    a protective layer at a sidewall of the head of the emitter.

6. The device structure of claim 5 wherein the protective layer comprises a doped region in the sidewall of the head of the emitter and having an opposite conductivity type from a bulk of the emitter.

7. The device structure of claim 5 wherein the protective layer comprises a dielectric spacer on the sidewall of the head of the emitter.

8. The device structure of claim 1 wherein the intrinsic base, the etch stop layer, and the extrinsic base have respective crystal structures with an epitaxial relationship.

* * * * *